(12) United States Patent
Brolin

(10) Patent No.: US 8,854,821 B2
(45) Date of Patent: Oct. 7, 2014

(54) BACKPLANE WIRING FOR AN INPUT-OUTPUT PANEL USED FOR FRONT OR REAR ACCESS

(75) Inventor: Stephen J. Brolin, Livingston, NJ (US)

(73) Assignee: Fujitsu Limited, Kawasaki-shi (JP)

( * ) Notice: Subject to any disclaimer, the term of this patent is extended or adjusted under 35 U.S.C. 154(b) by 457 days.

(21) Appl. No.: 13/346,875

(22) Filed: Jan. 10, 2012

(65) Prior Publication Data

US 2012/0106100 A1 May 3, 2012

Related U.S. Application Data

(62) Division of application No. 12/367,570, filed on Feb. 9, 2009, now Pat. No. 8,112,873.

(51) Int. Cl.
| | |
|---|---|
| H05K 5/00 | (2006.01) |
| H05K 7/00 | (2006.01) |
| A47B 81/00 | (2006.01) |
| A47F 5/00 | (2006.01) |
| H04Q 1/02 | (2006.01) |
| H05K 7/14 | (2006.01) |

(52) U.S. Cl.
CPC ............ *H05K 7/1459* (2013.01); *H04Q 1/155* (2013.01)
USPC ...... 361/724; 361/733; 361/760; 361/679.45; 361/679.57; 312/223.2; 312/223.1; 312/223.3; 211/184

(58) Field of Classification Search
USPC ............... 361/679.31–679.45, 679.55–679.6, 361/724–837, 679.01–679.04; 312/223.1, 312/223.2, 223.3, 265.1–265.4; 248/165, 248/295.11
See application file for complete search history.

(56) References Cited

U.S. PATENT DOCUMENTS

| | | | |
|---|---|---|---|
| 5,995,372 A | 11/1999 | Asakura | 361/737 |
| 6,175,508 B1 | 1/2001 | McMillian et al. | 361/796 |
| 6,496,639 B1* | 12/2002 | BuAbbud | 385/135 |
| 6,778,386 B2 | 8/2004 | Garnett et al. | 361/679.48 |
| 6,934,150 B2 | 8/2005 | Kitchen et al. | 361/679.33 |
| 7,304,858 B2 | 12/2007 | Saitou | 367/760 |
| 2006/0171133 A1* | 8/2006 | Pedoeem et al. | 361/796 |
| 2009/0227123 A1* | 9/2009 | Paya et al. | 439/49 |

* cited by examiner

*Primary Examiner* — Jenny L Wagner
*Assistant Examiner* — Jerry Wu
(74) *Attorney, Agent, or Firm* — Baker Botts L.L.P.

(57) ABSTRACT

According to one embodiment, an input-output (I-O) panel is transformed. The I-O panel is configured to couple to an array of first midplane connectors of a first shelf configured according to a first format, where the first shelf has rear access. The I-O panel comprises an array of I-O panel connectors and defines an xy-plane. An array of second midplane connectors of a second shelf is transformed to substantially align the second midplane connectors with the I-O panel connectors. The second shelf is configured according to a second format, where the second shelf has front access. The array of second midplane connectors is arranged in columns defining a midplane column axis and rows defining a midplane row axis.

6 Claims, 4 Drawing Sheets

BACKPLANE WIRING FOR AN INPUT-OUTPUT PANEL USED FOR FRONT OR REAR ACCESS

RELATED APPLICATION

The present application is a divisional application of U.S. patent application Ser. No. 12/367,570, entitled BACKPLANE WIRING FOR AN INPUT-OUTPUT PANEL USED FOR FRONT OR REAR ACCESS, filed Feb. 9, 2009.

TECHNICAL FIELD

This invention relates generally to the field of communication systems and more specifically to backplane wiring for an input-output panel used for front or rear access.

BACKGROUND

Circuit board shelves hold circuit boards. A circuit board shelf provides connectors into which the boards are plugged. Input may be provided to and output may be received from the boards through the shelf.

SUMMARY OF THE DISCLOSURE

In accordance with the present invention, disadvantages and problems associated with previous techniques for providing input to and receiving output from circuit board may be reduced or eliminated.

According to one embodiment, an input-output (I-O) panel is transformed. The I-O panel is configured to couple to an array of first midplane connectors of a first shelf configured according to a first format, where the first shelf has rear access. The I-O panel comprises an array of I-O panel connectors and defines an xy-plane. An array of second midplane connectors of a second shelf is transformed to substantially align the second midplane connectors with the I-O panel connectors. The second shelf is configured according to a second format, where the second shelf has front access. The array of second midplane connectors is arranged in columns defining a midplane column axis and rows defining a midplane row axis.

Certain embodiments of the invention may provide one or more technical advantages. A technical advantage of one embodiment may be that an input-output panel may be used with a first shelf having rear access configured according to a first format, or with a second shelf having front access configured according to a second format different from the first format. For example, the first format may be a Network Equipment Building Systems (NEBS) format, and the second format may be a European Telecommunications Standards Institute (ETSI) format. The second shelf may be wired to accommodate the input-output panel.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1 through 4 of the drawings, like numerals being used for like and corresponding parts of the various drawings.

In certain embodiments, midplane connectors may be employed to provide input-output connectivity to input-output panels in order to obtain more efficient use of backplane area. The connections between the midplane and input-output panel may be made by generic high density connectors. The outer surface of the input-output panel may provide media specific connectors, for example, multi-pair connectors, LAN connectors, or coaxial connectors. By selecting the appropriate input-output panel type, the same backplane may be effectively optimized for specific applications.

In certain embodiments, the same input-output panel may be used for rear access shelf designs (for example, NEBS shelves) and front access shelf designs (for example, ETSI shelves). The main difference between the rear and front access systems may be the backplane and shelf. The circuit boards and input-output panels may then be usable in both shelf designs.

Figure 1:
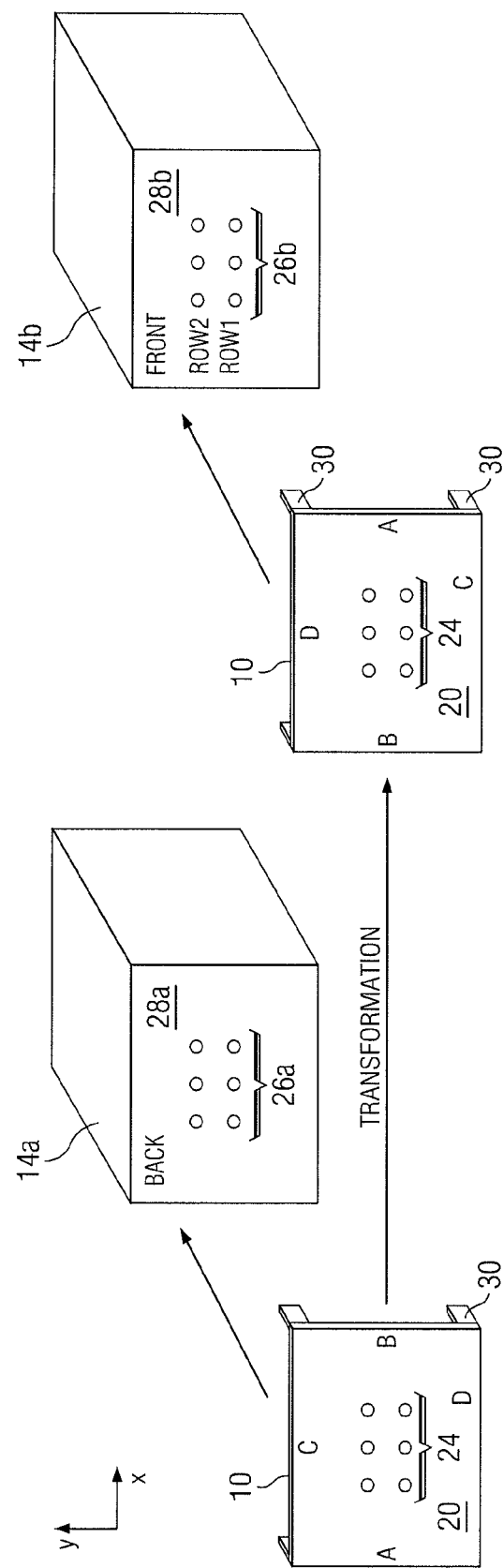
FIG. 1 illustrates an example of an input-output panel.

FIG. 1 illustrates an example of an apparatus 10 that includes an input-output panel 20. In certain embodiments, an input-output panel 20 may be used with first shelf 14a having rear access configured according to a first format, or with a second shelf 14b having front access configured according to a second format different from the first format. For example, the first format may be a Network Equipment Building Systems (NEBS) format, and the second format may be a European Telecommunications Standards Institute (ETSI) format. The second shelf may be wired to accommodate the input-output panel.

In certain embodiments, input-output panel 20 comprises an array of I-O panel connectors 24 that connect to midplane connectors 26 (26a,b) of a shelf 14 (14a,b). Midplane connectors 26 may be generic, high density connectors. I-O panel connectors 24 may be used to provide input to and/or receive output from connectors 26 of a shelf 14. A pair of corresponding connectors 24 and 26 may align and mate with each other.

In certain embodiments, shelf 14 comprises an array of midplane connectors 26, and input-output panel 20 comprises an array of I-O panel connectors 24. An array of elements may refer to elements arranged in rows and columns. In the embodiments, midplane connectors 26 and/or I-O panel 20 may undergo one or more transformations such that midplane connectors 26a are substantially aligned with I-O panel connectors 24.

In certain embodiments, the transformation may be one or more rotations in a plane or about an axis. In the illustrated embodiment, the rows of connectors 24 and 26 define an x-axis (a "row axis"), and the columns of connectors 24 and 26 define a y-axis (a "column axis"). In the embodiment, the rows of connectors 26b of shelf 14b undergoes a rotation about the x-axis by rewiring. The top row, Row 1, becomes the bottom row, and the bottom row, Row 2, becomes the top row. In the embodiment, input-output panel 20 undergoes a rotation of approximately 180 degrees in the xy-plane. (Sides A, B, C, and D of panel 20 are labeled to show the rotation.) In other embodiments, a transformation may be a rotation about the x-axis, a rotation about the y-axis, a rotation about the x-axis and a rotation about the y-axis, or other suitable transformation. The rotations may be any suitable number of degrees, such as 0 to 90, 90 to 180, 180 to 270, or 270 to 360 degrees.

Panel 20 may be configured to couple to a back 28a or front 28b of a shelf 14 (14a,b). In certain embodiments, panel 20 may be configured to couple to a back 28a of first shelf 14a and to couple to a front 28b of second shelf 14b. Panel 20 may have a coupling device 30 configured to couple input-output panels 20 to a shelf 14. Coupling device 30 may also provide mechanical support for panel 20 and may be used to guide panel 20 into place on shelf 14. An example of a coupling device 30 uses standoffs and screws.

In general, it is easier to transform panel 20 by moving it than to transform connectors 26 by rewiring them. Accordingly, the transformations may be selected to reduce the difficulty of rewiring. In one example, if the number of rows of connectors 26 is less than the number of columns, then the transformations may be selected to rotate the rows of connectors 26 about the x-axis to align the rows and rotate panel 20 in the xy-plane to align the columns. In another example, if the number of columns is less than the number of rows, then the transformations may be selected to rotate the rows of connectors 26 about the y-axis to align the rows and rotate (or not rotate) panel 20 in the xy-plane, depending on the application.

I-O panel 20 may comprise any suitable substantially rigid material, for example, metal or plastic. I-O panel 20 may be any suitable size or shape to cover some or all of a plane of shelf 14. I-O panel connectors 24 may be any suitable interface configured to provide input to and/or receive output from connectors 26 of a shelf 14.

In certain embodiments, shelf 14 represents a shelf that holds and otherwise supports plug-in units (PIUs) such as circuit cards. Shelf 14 may have a midplane that connects to the PIUs. One subset of the PIUs ("upper PIUs") may be on one side of the midplane, and another subset ("lower PIUs") may be on the other side. The upper PIUs may be above or on the side of the midplane, and the lower may be below the midplane or on the other side of the midplane.

The midplane has midplane connectors. The midplane connectors couple to the PIU connectors and operate as extensions of the PIU connectors. The midplane connectors may be mounted to the backplane and may couple to the PIU connectors via the shelf backplane. Providing input to and receiving output from the PIUs may be accomplished through the midplane connectors. Accordingly, I-O panel connectors 24 may be used to provide input to and/or receive output from the PIUs. Back 28a or front 28b of shelf 14 may provide pin assignments for the midplane connectors.

Figure 2A:
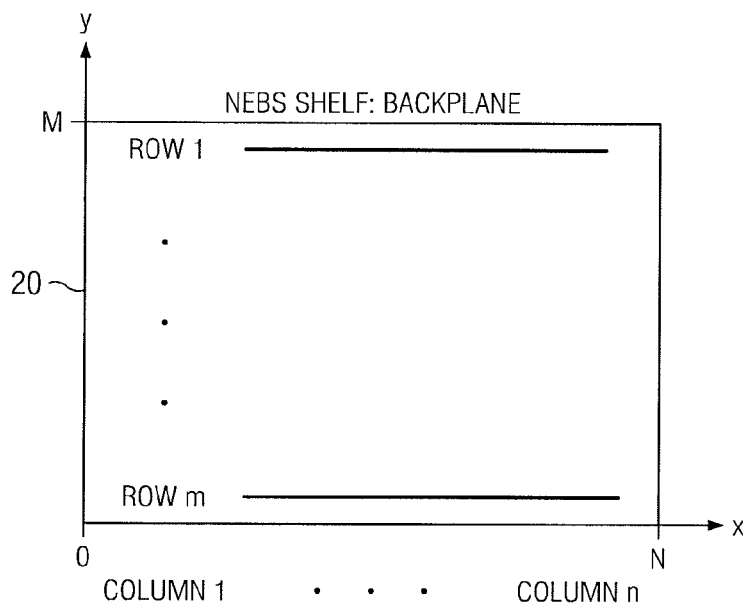
FIGS. 2A and 2B illustrate examples of midplane connector arrays.
Figure 2B:
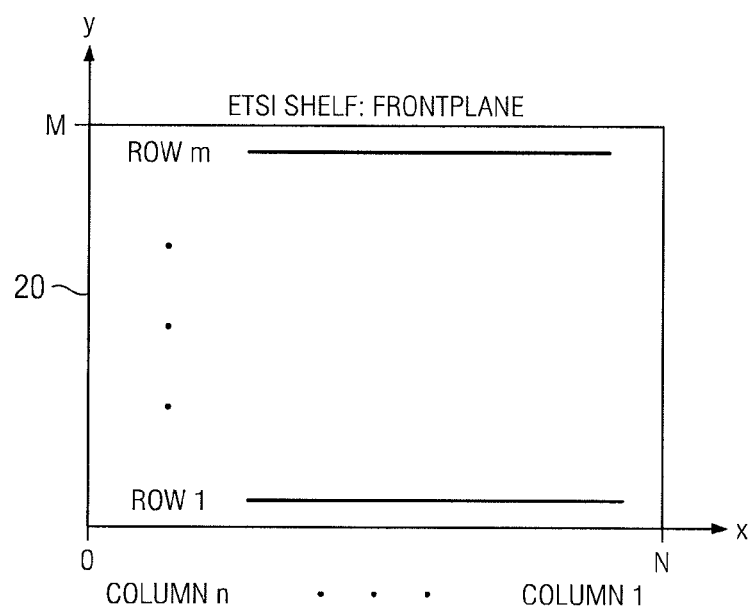

FIGS. 2A and 2B illustrate examples of midplane connector arrays. FIG. 2A illustrates a midplane connector array for a NEBS shelf. FIG. 2B illustrates a midplane connector array for an ETSI shelf.

In the illustrated example, Row x, x=1, 2, . . . , m, represent midplane rows of midplane connectors 26 aligned parallel to an x-axis, and Column y, y=1, 2, . . . , n, represent midplane columns of midplane connectors 26 parallel to a y-axis. The midplane connector array for a NEBS shelf has Row 1 proximate to y=M, Row m proximate to y=0, Column 1 proximate to x=0, and Column n proximate to x=N. The midplane connector array for an ETSI shelf has Row 1 proximate to y=0, Row m proximate to y=M, Column 1 proximate to x=N, and Column n proximate to x=0.

In certain embodiments, input-output panel 20 used for the NEBS shelf rotated 180 degrees in the xy-plane for use with the ETSI shelf. Midplane connectors 26 of the ETSI shelf are rotated about the x-axis.

TABLES 1 and 2 show examples of arrangements of pin assignments for midplane connectors 26. TABLE 1 shows an example of an arrangement for a NEBS shelf, viewed from the back of the shelf.

TABLE 1

|   | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| A | A1 | A2 | A3 | A4 | A5 | A6 | A7 | A8 | A9 | A10 | A11 | A12 | A13 | A14 | A15 | A16 | A17 | A18 | A19 | A20 |
| B | B1 | B2 | B3 | B4 | B5 | B6 | B7 | B8 | B9 | B10 | B11 | B12 | B13 | B14 | B15 | B16 | B17 | B18 | B19 | B20 |
| C | C1 | C2 | C3 | C4 | C5 | C6 | C7 | C8 | C9 | C10 | C11 | C12 | C13 | C14 | C15 | C16 | C17 | C18 | C19 | C20 |
| D | D1 | D2 | D3 | D4 | D5 | D6 | D7 | D8 | D9 | D10 | D11 | D12 | D13 | D14 | D15 | D16 | D17 | D18 | D19 | D20 |
| E | E1 | E2 | E3 | E4 | E5 | E6 | E7 | E8 | E9 | E10 | E11 | E12 | E13 | E14 | E15 | E16 | E17 | E18 | E19 | E20 |
| F | F1 | F2 | F3 | F4 | F5 | F6 | F7 | F8 | F9 | F10 | F11 | F12 | F13 | F14 | F15 | F16 | F17 | F18 | F19 | F20 |
| G | G1 | G2 | G3 | G4 | G5 | G6 | G7 | G8 | G9 | G10 | G11 | G12 | G13 | G14 | G15 | G16 | G17 | G18 | G19 | G20 |
| H | H1 | H2 | H3 | H4 | H5 | H6 | H7 | H8 | H9 | H10 | H11 | H12 | H13 | H14 | H15 | H16 | H17 | H18 | H19 | H20 |

TABLE 2 shows an example of an arrangement for an ETSI shelf, viewed from the front of the shelf.

TABLE 2

|   | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| A | H20 | H19 | H18 | H17 | H16 | H15 | H14 | H13 | H12 | H11 | H10 | H9 | H8 | H7 | H6 | H5 | H4 | H3 | H2 | H1 |
| B | G20 | G19 | G18 | G17 | G16 | G15 | G14 | G13 | G12 | G11 | G10 | G9 | G8 | G7 | G6 | G5 | G4 | G3 | G2 | G1 |
| C | F20 | F19 | F18 | F17 | F16 | F15 | F14 | F13 | F12 | F11 | F10 | F9 | F8 | F7 | F6 | F5 | F4 | F3 | F2 | F1 |
| D | E20 | E19 | E18 | E17 | E16 | E15 | E14 | E13 | E12 | E11 | E10 | E9 | E8 | E7 | E6 | E5 | E4 | E3 | E2 | E1 |
| E | D20 | D19 | D18 | D17 | D16 | D15 | D14 | D13 | D12 | D11 | D10 | D9 | D8 | D7 | D6 | D5 | D4 | D3 | D2 | D1 |
| F | C20 | C19 | C18 | C17 | C16 | C15 | C14 | C13 | C12 | C11 | C10 | C9 | C8 | C7 | C6 | C5 | C4 | C3 | C2 | C1 |
| G | B20 | B19 | B18 | B17 | B16 | B15 | B14 | B13 | B12 | B11 | B10 | B9 | B8 | B7 | B6 | B5 | B4 | B3 | B2 | B1 |
| H | A20 | A19 | A18 | A17 | A16 | A15 | A14 | A13 | A12 | A11 | A10 | A9 | A8 | A7 | A6 | A5 | A4 | A3 | A2 | A1 |

Figure 3:
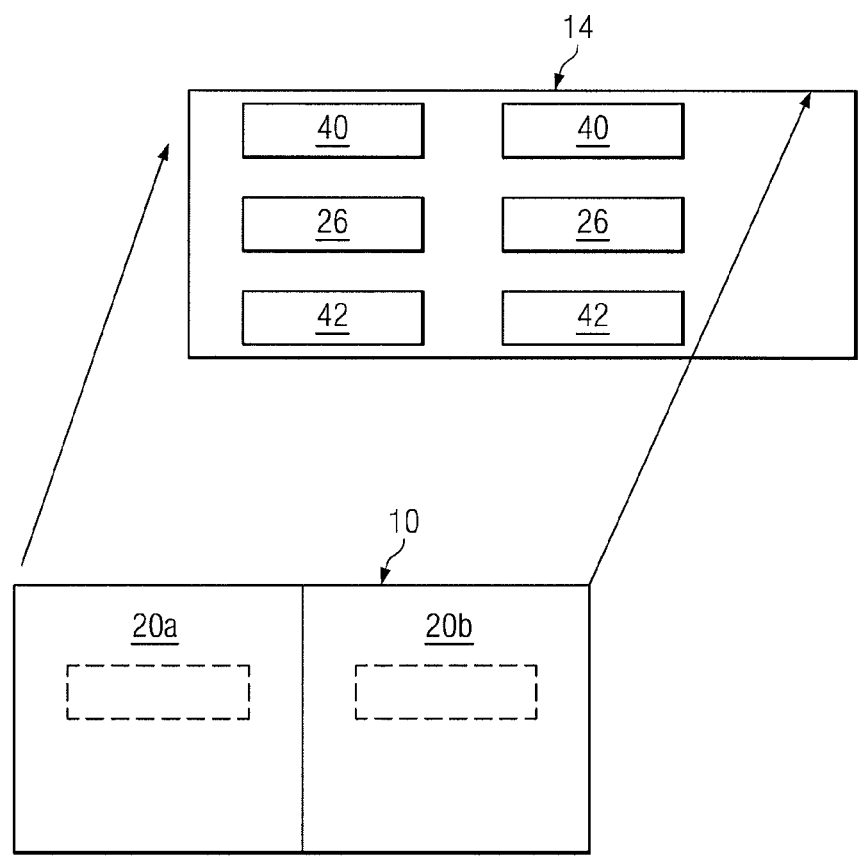
FIG. 3 illustrates one embodiment of the input-output panel used with a NEBS shelf.

FIG. 3 illustrates one embodiment of panel 20 used with NEBS shelf 14a. In the illustrated embodiment, NEBS shelf 14a includes midplane connectors 26, upper PIU connectors 40, and lower PIU connectors 42 arranged as shown. Panel 20 couples to NEBS shelf 14a as shown.

Figure 4:
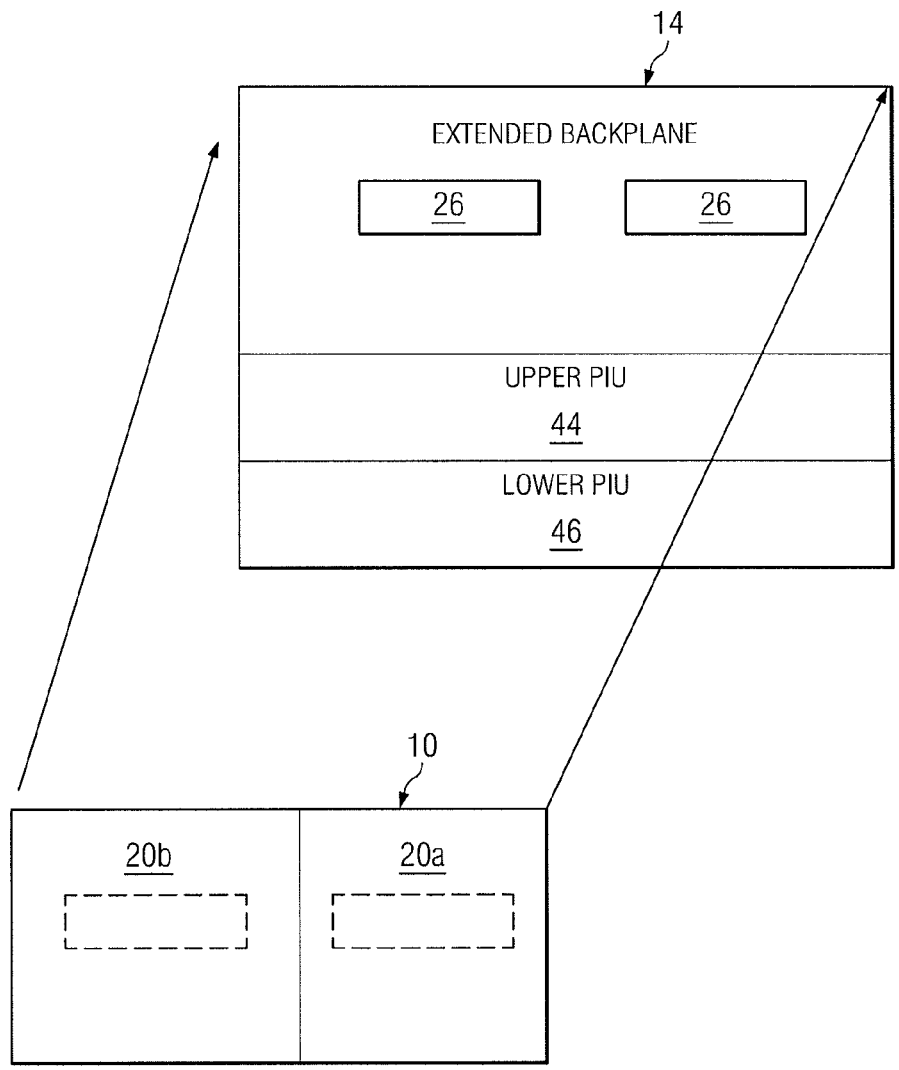
FIG. 4 illustrates one embodiment of the input-output panel used with an ETSI shelf.

FIG. 4 illustrates one embodiment of panel 20 used with ETSI shelf 14b. In the illustrated embodiment, ETSI shelf 14b includes midplane connectors 26, upper PIUs 44, and lower PIUs 46 arranged as shown. Panel 20 couples to ETSI shelf 14b as shown.

Modifications, additions, or omissions may be made to the apparatuses disclosed herein without departing from the scope of the invention. The components of the apparatuses may be integrated or separated. Moreover, the operations of the apparatuses may be performed by more, fewer, or other components. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

Certain embodiments of the invention may provide one or more technical advantages. A technical advantage of one embodiment may be that an input-output panel may be used with a first shelf having rear access configured according to a first format, or with a second shelf having front access configured according to a second format different from the first format. For example, the first format may be a Network Equipment Building Systems (NEBS) format, and the second format may be a European Telecommunications Standards Institute (ETSI) format. The second shelf may be wired to accommodate the input-output panel.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed is:

1. An apparatus comprising:
   an input-output (I-O) panel comprising an array of I-O panel connectors arranged in:
   a plurality of I-O panel rows defining a row axis; and
   a plurality of I-O panel columns defining a column axis, the I-O panel defining an xy-plane;
   the I-O panel columns arranged to:
   align with a plurality of first midplane connector columns of a plurality of first midplane connectors of a first shelf configured according to a first format; and
   after a substantially 180 degree rotation in the xy-plane, align with a plurality of second midplane connector columns of a plurality of second midplane connectors of a second shelf configured according to a second format different from the first format.

2. The apparatus of claim 1, the I-O panel rows arranged to:
   align with a plurality of first midplane connector rows of the first midplane connectors; and
   after rotating a plurality of second midplane connector rows of the second midplane connectors about the row axis, align with the second midplane connector rows.

3. The apparatus of claim 1, the I-O panel rows arranged to:
   align with a plurality of first midplane connector rows of the first midplane connectors; and
   after a substantially 180 degree rotation in the xy-plane, align with the second midplane connector rows.

4. The apparatus of claim 1, the I-O panel rows are arranged to:
   align with a plurality of first midplane connector rows of the first midplane connectors; and
   align with a plurality of second midplane connector rows of the second midplane connectors.

5. The apparatus of claim 1, the first format comprising a Network Equipment Building Systems (NEBS) format.

6. The apparatus of claim 1, the second format comprising a European Telecommunications Standards Institute (ETSI) format.

* * * * *